(12) United States Patent
Guo et al.

(10) Patent No.: US 11,394,012 B2
(45) Date of Patent: Jul. 19, 2022

(54) ORGANIC LIGHT-EMITTING DEVICE INCLUDING LIGHT OUTPUTTING LAYER HAVING WAVY SHAPE, AND MANUFACTURING METHOD THEREFOR

(71) Applicant: BOE TECHNOLOGY GROUP CO., LTD., Beijing (CN)

(72) Inventors: Yuanzheng Guo, Beijing (CN); Ping Song, Beijing (CN); Youwei Wang, Beijing (CN); Tao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 699 days.

(21) Appl. No.: 16/323,336

(22) PCT Filed: May 14, 2018

(86) PCT No.: PCT/CN2018/086708
§ 371 (c)(1),
(2) Date: Feb. 5, 2019

(87) PCT Pub. No.: WO2018/228107
PCT Pub. Date: Dec. 20, 2018

(65) Prior Publication Data
US 2021/0305540 A1 Sep. 30, 2021

(30) Foreign Application Priority Data
Jun. 12, 2017 (CN) .......................... 201710437795.6

(51) Int. Cl.
*H01L 51/52* (2006.01)
*H01L 51/56* (2006.01)

(52) U.S. Cl.
CPC ...... *H01L 51/5275* (2013.01); *H01L 51/5253* (2013.01); *H01L 51/56* (2013.01); *H01L 2251/533* (2013.01)

(58) Field of Classification Search
CPC .. H01L 51/5253; H01L 51/5275; H01L 51/56
USPC .......................................................... 257/40
See application file for complete search history.

(56) References Cited

U.S. PATENT DOCUMENTS

2007/0200492 A1* 8/2007 Cok ................... H01L 51/5284
  313/506
2011/0210344 A1  9/2011 Han et al.
2016/0327695 A1* 11/2016 Masuyama .......... G02B 5/0221

FOREIGN PATENT DOCUMENTS

| CN | 101752400 A | 6/2010 |
| CN | 102148337 A | 8/2011 |
| CN | 104808267 A | 7/2015 |

(Continued)

OTHER PUBLICATIONS

International Search Report of PCT/CN2018/086708 in Chinese, dated Aug. 6, 2018, with English translation.

(Continued)

*Primary Examiner* — Matthew E. Gordon
(74) *Attorney, Agent, or Firm* — Collard & Roe, P.C.

(57) ABSTRACT

An organic light emitting device and a method of manufacturing an organic light emitting device. The organic light emitting device includes a transparent light extracting component including a light outputting layer on a light outputting side, and at least one surface of the light outputting layer has a first wavy shape.

16 Claims, 3 Drawing Sheets

(56) References Cited

FOREIGN PATENT DOCUMENTS

| CN | 106134287 A | 11/2016 |
|---|---|---|
| CN | 107275500 A | 10/2017 |

OTHER PUBLICATIONS

Notice of Transmittal of the International Search Report of PCT/CN2018/086708 in Chinese, dated Aug. 6, 2018.
Written Opinion of the International Searching Authority of PCT/CN2018/086708 in Chinese, dated Aug. 6, 2018 with English translation.

* cited by examiner forming a transparent light extracting component comprising at least a light outputting layer on a light outputting side of the organic light emitting device, and at least one surface of the light outputting layer having a first wavy shape — 101
FIG. 8
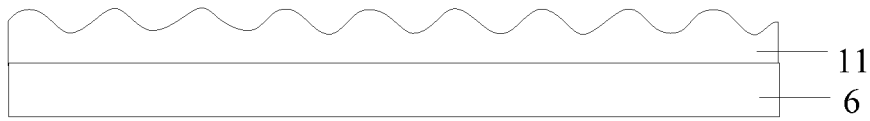
FIG. 9
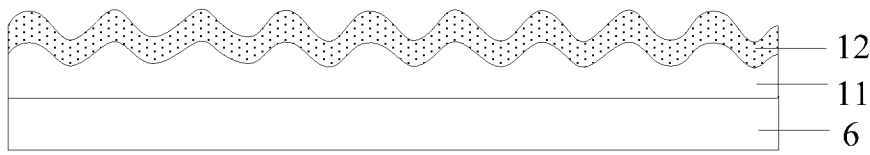
FIG. 10
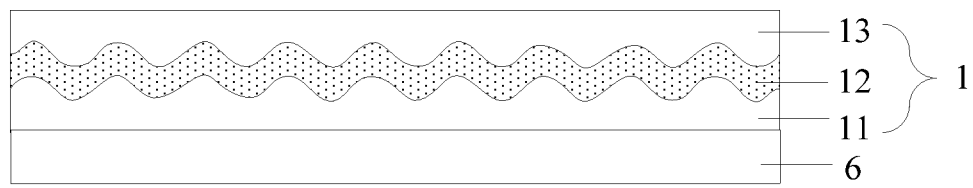
FIG. 11 ial light extracting component further com-
prises a planarization layer on the shape preserving layer and
in contact with the shape preserving layer; and a surface of
the planarization layer facing the shape preserving layer has
a fourth wavy shape, a pattern of the fourth wavy shape is
complementary to a pattern of the third wavy shape, and a
surface of the planarization layer away from the shape
preserving layer is planar.
ORGANIC LIGHT-EMITTING DEVICE INCLUDING LIGHT OUTPUTTING LAYER HAVING WAVY SHAPE, AND MANUFACTURING METHOD THEREFOR

CROSS REFERENCE TO RELATED APPLICATIONS

This application is the National Stage of PCT/CN2018/086708 filed on May 14, 2018, which claims priority under 35 U.S.C. § 119 of Chinese Application No. 201710437795.6 filed on Jun. 12, 2017, the disclosure of which is incorporated by reference.

TECHNICAL FIELD

Embodiments of the present disclosure relate to an organic light emitting device and a method of manufacturing an organic light emitting device.

BACKGROUND

Flat panel displays (FPDs) have become mainstream products in the market, and there are more and more types of flat panel displays, such as liquid crystal displays (LCDs), organic light emitting diode (OLED) displays, plasma display panels (PDPs), field emission displays (FEDs), etc.

OLED displays are called fantasy displays. They have the advantages such as being all solid state, flexible, wide color gamut, wide viewing angles and fast response times, and thus have broad development prospects in fields of display, illumination, etc. OLED device generally comprises a base substrate, an anode, a cathode, an organic light emitting layer between the two electrodes, and an encapsulation structure. Because refractive indices of the layers are different, the light transmits at part of the interface of the device, reflection and refraction further occur, and eventually the light dissipates inside the device. Only 20% of the light of the OLED device is extracted, and thus there is a problem that the light extraction efficiency is low.

SUMMARY

Embodiments of the present disclosure provide an organic light emitting device and a method of manufacturing an organic light emitting device, to improve the light extraction efficiency of the organic light emitting device.

An embodiment of the present disclosure provides an organic light emitting device, wherein the organic light emitting device is provided with a transparent light extracting component on a light outputting side, the transparent light extracting component comprising at least a light outputting layer, and at least one surface of the light outputting layer has a first wavy shape.

For example, the light extracting component further comprises a shape preserving layer on the light outputting layer and in contact with the light outputting layer, and a surface of the light outputting layer facing the shape preserving layer has the first wavy shape; and a surface of the shape preserving layer facing the light outputting layer has a second wavy shape, a pattern of the second wavy shape is complementary to a pattern of the first wavy shape, and a surface of the shape preserving layer away from the light outputting layer has a third wavy shape.

For example, a material of the shape preserving layer comprises silicon oxide or silicon nitride.

For example, the light extracting component further comprises a planarization layer on the shape preserving layer and in contact with the shape preserving layer; and a surface of the planarization layer facing the shape preserving layer has a fourth wavy shape, a pattern of the fourth wavy shape is complementary to a pattern of the third wavy shape, and a surface of the planarization layer away from the shape preserving layer is planar.

For example, the organic light emitting device is a bottom-emitting organic light emitting device, and the light extracting component is a base substrate of the organic light emitting device.

For example, the organic light emitting device is a bottom-emitting organic light emitting device, and the organic light emitting device further comprises a base substrate and a thin film transistor layer on the base substrate; and the light extracting component is between the base substrate and the thin film transistor layer.

An embodiment of the present disclosure further provides a method of manufacturing an organic light emitting device, the method comprises: forming a transparent light extracting component comprising at least a light outputting layer on a light outputting side of the organic light emitting device, and at least one surface of the light outputting layer has a first wavy shape.

For example, the forming the transparent light extracting component comprising at least the light outputting layer on the light outputting side of the organic light emitting device comprises: providing a carrier plate; and forming the light outputting layer having the first wavy shape on the surface by adjusting a moving speed of a coating device when coating, a coating amount at a corresponding position, or a distance between a coating head of the coating device and the carrier plate.

For example, subsequent to forming the light outputting layer having the first wavy shape on the surface, the method further comprises: depositing an inorganic layer on the light outputting layer as a shape preserving layer, so that a surface of the shape preserving layer facing the light outputting layer has a second wavy shape, a surface of the shape preserving layer away from the light outputting layer has a third wavy shape, and a pattern of the second wavy shape is complementary to a pattern of the first wavy shape.

For example, subsequent to depositing the inorganic layer on the light outputting layer as the shape preserving layer, the method further comprises: coating a planarization layer on the shape preserving layer and in contact with the shape preserving layer, and planarizing the planarization layer, so that a surface of the planarization layer facing the shape preserving layer has a fourth wavy shape, a surface of the planarization layer away from the shape preserving layer is planar, and a pattern of the fourth wavy shape is complementary to a pattern of the third wavy shape.

BRIEF DESCRIPTION OF THE DRAWINGS

In order to clearly illustrate the technical solutions of the embodiments of the disclosure, the drawings of the embodiments will be briefly described in the following. It is obvious that the described drawings are only related to some embodiments of the disclosure and thus are not limitative of the disclosure.

FIG. 8 is a flow chart of manufacturing an organic light emitting device provided by an embodiment of the present disclosure;

FIG. 9 is a schematic structural diagram showing a light outputting layer is formed on a carrier plate according to an embodiment of the present disclosure;

FIG. 10 is a schematic structural diagram showing a shape preserving layer is formed on a carrier plate according to an embodiment of the present disclosure; and FIG. 11 is a schematic structural diagram showing a planarization layer is formed on a carrier plate according to an embodiment of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
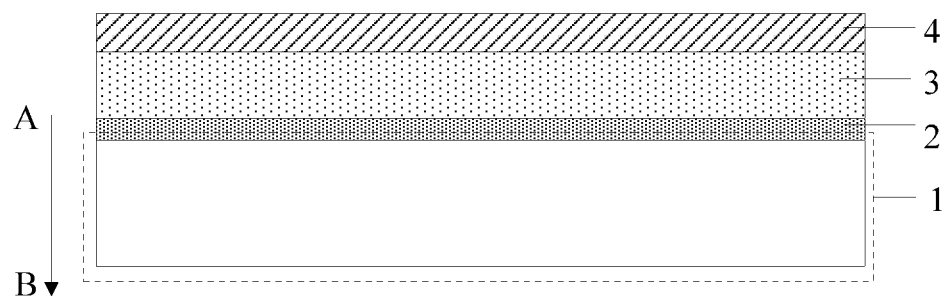
FIG. 1 is a schematic structural diagram of a bottom-emitting organic light emitting device provided by an embodiment of the present disclosure.

Referring to FIG. 1, an embodiment of the present disclosure provides an organic light emitting device, which comprises: a light extracting component 1, a thin film transistor layer 2 on the light extracting component 1, a light emitting layer 3 on the thin film transistor layer 2 (the light emitting layer may comprise an anode layer, an organic material layer, and a cathode layer), and an encapsulation layer 4 on the light emitting layer 3. The organic light emitting device emits light in a direction indicated by an arrow AB.

Figure 2:
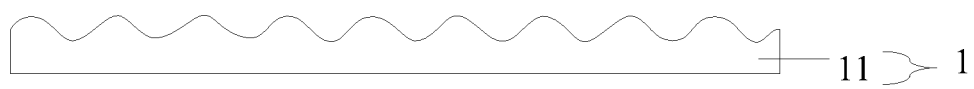
FIG. 2 is a schematic structural diagram of a light extracting component comprising a light outputting layer provided by an embodiment of the present disclosure.

As illustrated in FIG. 2, the light extracting component 1 comprises at least a light outputting layer 11, and at least one surface of the light outputting layer 11 has a first wavy shape. In specific implementations, one surface of the light outputting layer may have the first wavy shape, or both surfaces of the light outputting layer may have the first wavy shape. For example, in order to improve the light extraction efficiency of the organic light emitting device and simplify the manufacturing process of the organic light emitting device, the light outputting layer of the organic light emitting device has one surface having the first wavy shape, and the surface of the light outputting layer away from the bottom of the organic light emitting device has the first wavy shape. In specific implementations, the light extracting component may directly serve as a base substrate of the organic light emitting device, for example, as illustrated in FIG. 1. The light extracting component may also be a separate component of the organic light emitting device. In a case where the light extracting component serves as the base substrate of the organic light emitting device, a surface of the light outputting layer facing the light emitting layer has the first wavy shape; and in a case where the light extracting component is a separate component of the organic light emitting device and is disposed on a base substrate, the surface of the light outputting layer away from the base substrate has the first wavy shape. In addition, it should be noted that the surface of the light outputting layer in the embodiments of the present disclosure refers to the surface of the light outputting layer in the direction perpendicular to the base substrate, that is, a surface which is in contact with other functional layers in the organic light emitting device. The shape of the first wavy shape may be similar to a surface formed by a plurality of semi-prisms arranged side by side.

Figure 3:
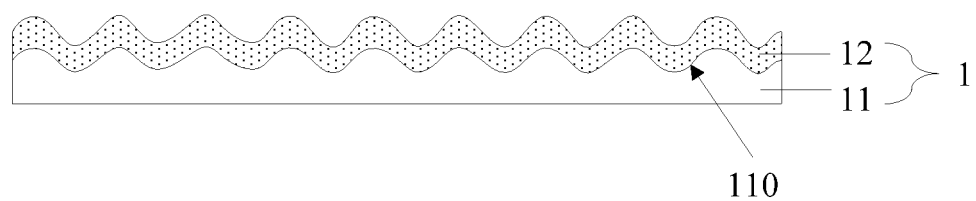
FIG. 3 is a schematic structural diagram of a light extracting component comprising a light outputting layer and a shape preserving layer provided by an embodiment of the present disclosure.

For example, as illustrated in FIG. 3, the light extracting component 1 further comprises a shape preserving layer 12 on the light outputting layer 11 and in contact with the light outputting layer 11, and a surface of the light outputting layer 11 facing the shape preserving layer 12 has the first wavy shape. A surface of the shape preserving layer 12 facing the light outputting layer 11 has a second wavy shape, and a pattern of the second wavy shape is complementary to a pattern of the first wavy shape. That is, for the shape preserving layer 12, the wave crest of the pattern of the second wavy shape of the shape preserving layer 12 is directed to the trough of the pattern of the first wavy shape of the light outputting layer 11, and the tough of the pattern of the second wavy shape of the shape preserving layer 12 is directed to the wave crest of the pattern of the first wavy shape of the light outputting layer 11. That is, in the embodiments of the present disclosure, in order to enable the organic light emitting device to have a higher light extraction efficiency, the surface having the first wavy shape of the light outputting layer 11 may be preserved, i.e., the light extracting component 1 may be provided with the shape preserving layer 12 on the surface having the first wavy shape. For example, as illustrated in FIG. 3, an upper surface 110 of the light outputting layer 11 is provided with the first wavy shape, and the light extracting component 1 is further provided with the shape preserving layer 12 on the light outputting layer 11 and in contact with the light outputting layer 11, to preserve the surface having the first wavy shape of the light outputting layer 11.

For example, a material of the shape preserving layer may comprise silicon oxide or silicon nitride. In a case where the shape preserving layer comprises silicon oxide or silicon nitride, the shape preserving layer can have the ability of preventing water and oxygen while protecting the shape of the surface having the first wavy shape of the light outputting layer, thereby extending the life of the organic light emitting device. For example, a surface of the shape preserving layer 12 away from the light outputting layer has a third wavy shape to form one more wavy interface in the light extracting component 1, thereby improving the water and oxygen preventing ability of the organic light emitting device as well as further enhancing the light extraction efficiency of the organic light emitting device. For example, a thin film of silicon oxide or silicon nitride may be deposited on the light outputting layer 11 as the shape preserving layer 12. For example, a pattern of the third wavy shape may be the same as the pattern of the first wavy shape to simplify the manufacturing process of the light extracting component.

Figure 4:
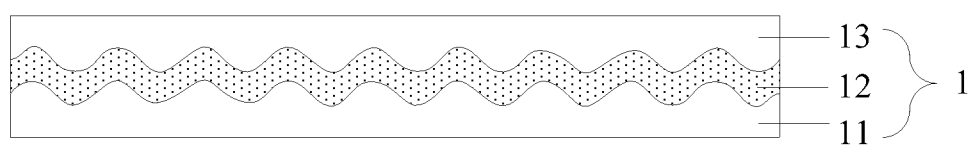
FIG. 4 is a schematic structural diagram of a light extracting component comprising a light outputting layer, a shape preserving layer and a planarization layer provided by an embodiment of the present disclosure.
Figure 5:
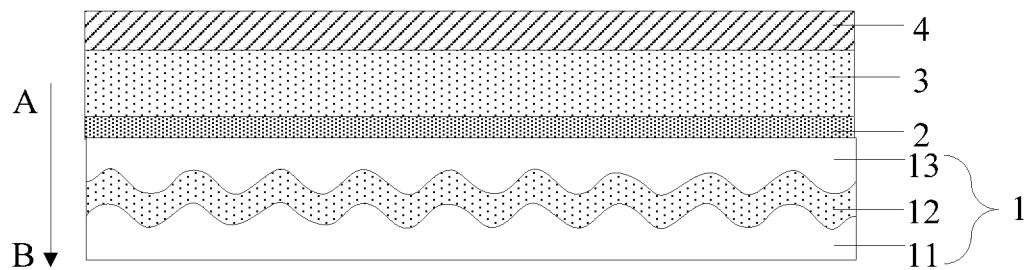
FIG. 5 is a schematic structural diagram of a bottom-emitting organic light emitting device provided by an embodiment of the present disclosure.

For example, referring to FIG. 4, the light extracting component 1 further comprises a planarization layer 13 on the shape preserving layer 12 and in contact with the shape preserving layer 12. A surface of the planarization layer 13 facing the shape preserving layer 12 has a fourth wavy shape, a pattern of the fourth wavy shape is complementary to the pattern of the third wavy shape, and a surface of the planarization layer 13 away from the shape preserving layer 12 is planar. That is, in the light extracting component provided by the embodiment of the present disclosure, in order not to affect the manufacture of other functional layers of the organic light emitting device, the planarization layer may be disposed on the shape preserving layer. An overall structural diagram of the organic light emitting device provided with the light extracting component comprising the light outputting layer, the shape preserving layer and the planarization layer is illustrated in FIG. 5. It should be noted that the organic light emitting device in the embodiments of the present disclosure is described by taking that the organic light emitting device comprises the thin film transistor layer as an example, but the embodiments of the present disclosure are not limited thereto.

Figure 6:
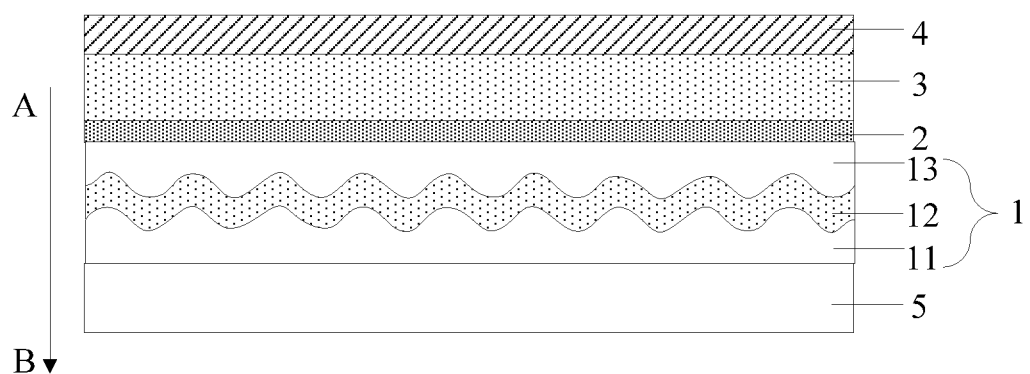
FIG. 6 is a schematic structural diagram of another bottom-emitting organic light emitting device provided by an embodiment of the present disclosure.
Figure 7:
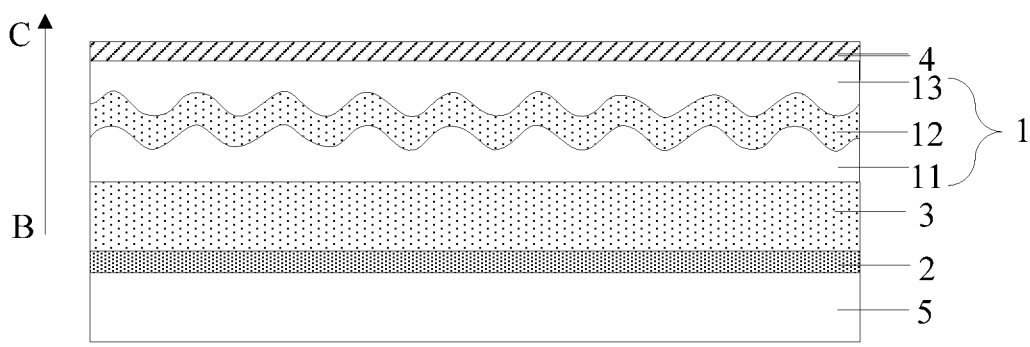
FIG. 7 is a schematic structural diagram of a top-emitting organic light emitting device provided by an embodiment of the present disclosure.

It should be noted that the embodiment in FIG. 1 is described as an example in which the organic light emitting device is a bottom-emitting device and the light extracting component serves as the base substrate, but the embodiments of the present disclosure are not limited thereto. In specific implementations, referring to FIG. 6, for the bottom-emitting organic light emitting device, the light extracting component 1 in the embodiment of the present disclosure may also be a separate component. The organic light emitting device further comprises a base substrate 5. The light extracting component 1 is disposed on the light outputting side of the bottom-emitting light emitting device, and may be disposed between the base substrate 5 and the thin film transistor layer 2. Certainly, the thin film transistor layer 2 may be a composite layer comprising a plurality of layers. Referring to FIG. 7, the organic light emitting device may also be a top-emitting device. The top-emitting organic light emitting device comprises, in order, a thin film transistor layer 2 on a base substrate 5, a light emitting layer 3 on the thin film transistor layer 2, and an encapsulation layer 4 on the light emitting layer 3. light is emitted outside in the direction indicated by an arrow BC. The light extracting component 1 is disposed on the light emitting layer 3, and may be disposed between the light emitting layer and the encapsulation layer 4, or may directly serve as an encapsulation layer.

A material of the light outputting layer of the light extracting component may be polyimide (PI). In order to facilitate the manufacture of the light extracting component, a material of the planarization layer may also be PI, that is, the light outputting layer 11 and the planarization layer 13 of the light extracting component 1 in the embodiments of the present disclosure are formed by two coating processes.

Referring to FIG. 8, an embodiment of the present disclosure further provides a method of manufacturing an organic light emitting device. The method comprises: step 101: forming a transparent light extracting component comprising at least a light outputting layer, wherein at least one surface of the light outputting layer has a first wavy shape.

For example, forming the transparent light extracting component comprising at least the light outputting layer on the light outputting side of the organic light emitting device comprises:

providing a carrier plate, wherein the carrier plate may be a base substrate of the organic light emitting device, or may only be a support plate for manufacturing the light extracting component (the light extracting component needs to be separated from the carrier plate later); and forming the light outputting layer having the first wavy shape on the surface by adjusting a moving speed of a coating device when coating, coating amounts at corresponding positions, or distances between a coating head of the coating device and the carrier plate.

For example, after forming the light outputting layer having the first wavy shape on the surface by adjusting the moving speed of the coating device when coating, the coating amounts at the corresponding positions, or the distances between the coating head of the coating device and the carrier plate, the method further comprises: depositing an inorganic layer on the light outputting layer as a shape preserving layer, so that a surface of the shape preserving layer facing the light outputting layer has a second wavy shape, a surface of the shape preserving layer away from the light outputting layer has a third wavy shape, and a pattern of the second wavy shape is complementary to a pattern of the first wavy shape.

For example, after depositing the inorganic layer on the light outputting layer as the shape preserving layer, the method further comprises: coating a planarization layer on the shape preserving layer and in contact with the shape preserving layer, and planarizing the planarization layer, so that a surface of the planarization layer facing the shape preserving layer has a fourth wavy shape, a surface of the planarization layer away from the shape preserving layer is planar, and a pattern of the fourth wavy shape is complementary to a pattern of the third wavy shape. A layer of PI may be coated on the shape preserving layer by a common coating method, and PI may flow to planarize the uneven surface of the layer.

The method of manufacturing the organic light emitting device provided by the embodiments of the present disclosure will be describe in detail by way of examples with reference to FIGS. 9-11. An embodiment of the present disclosure provides a method of manufacturing an organic light emitting device. The organic light emitting device is a flexible bottom-emitting device, and the light extracting component serves as a base substrate of the organic light emitting device. The method comprises following steps.

In step one, by adjusting the coating speed of the coating device in the corresponding region, a layer of PI is coated on a carrier plate 6 to form a light outputting layer 11 having a first wavy shape on a surface. The carrier plate may be a glass substrate. A schematic diagram showing the light outputting layer is formed on the carrier plate is illustrated in FIG. 9.

In step two, an inorganic layer of SiO is deposited on the light outputting layer 11 to form a shape preserving layer 12. A schematic diagram showing the shape preserving layer is formed is illustrated in FIG. 10.

In step three, a second layer of PI is coated on the shape preserving layer 12 to form a planarization layer 13, and a three-layer structure comprising the light outputting layer 11, the shape preserving layer 12 and the planarization layer 13 serves as the light extracting component 1. A schematic diagram showing the planarization layer is formed on the shape preserving layer is illustrated in FIG. 11.

In step four, the light extracting component 1 is separated from the carrier plate 6 to form the light extracting component 1.

Certainly, other functional layers of the organic light emitting device may also be formed on the planarization layer before separating the light extracting component from the carrier plate. An embodiment of the present disclosure provides a method of manufacturing an organic light emitting device. The organic light emitting device is a bottom-emitting device, and the light extracting component is disposed between a base substrate and a thin film transistor layer of the organic light emitting device. The method comprises following steps.

In step one, by adjusting the coating speed of the coating device in the corresponding region, a layer of PI is coated on a carrier plate 6 to form a light outputting layer 11 having a first wavy shape on a surface. The carrier plate 6 may be a base substrate of the organic light emitting device, and the base substrate may be a glass substrate. A schematic diagram showing the light outputting layer is formed on the carrier plate is illustrated in FIG. 9.

In step two, an inorganic layer of SiO is deposited on the light outputting layer 11 to form a shape preserving layer 12. A schematic diagram showing the shape preserving layer is formed is illustrated in FIG. 10.

In step three, a second layer of PI is coated on the shape preserving layer 12 to form a planarization layer 13, and a three-layer structure comprising the light outputting layer 11, the shape preserving layer 12 and the planarization layer 13 serves as the light extracting component 1. A schematic diagram showing the light extracting component is formed on the base substrate is illustrated in FIG. 11.

Certainly, other functional layers of the organic light emitting device can also be formed on the planarization layer. Compared with the above embodiment, the light extracting component in the present embodiment may not be separated from the carrier plate, and the carrier plate may directly serve as the base substrate of the organic light emitting device, that is, the light extracting component is directly formed on the base substrate in the present embodiment of the present disclosure.

In the embodiments of the present disclosure, the transparent light extracting component is disposed on the light outputting side of the organic light emitting device, the light extracting component comprises at least the light outputting layer, and at least one surface of the light outputting layer has the first wavy shape. The wavy interface may prevent the light from being reflected at interfaces in the form of parallel light, thereby reducing the optical loss when the light is reflected at the interface, and improving the light extraction efficiency of the organic light emitting device.

What have been described above are only specific implementations of the present disclosure, the protection scope of the present disclosure is not limited thereto, and the protection scope of the present disclosure should be based on the protection scope of the claims.

What is claimed is:

1. An organic light emitting device, comprising a transparent light extracting component on a light outputting side, the transparent light extracting component comprising a light outputting layer, and at least one surface of the light outputting layer having a first wavy shape,
   wherein the transparent light extracting component further comprises a shape preserving layer on the light outputting layer in a light exiting direction of the organic light emitting device and in contact with the light outputting layer, and a surface of the light outputting layer facing the shape preserving layer has the first wavy shape;
   a surface of the shape preserving layer facing the light outputting layer has a second wavy shape, the second wavy shape is complementary to the first wavy shape;
   a surface of the shape preserving layer away from the light outputting layer has a third wavy shape,
   the transparent light extracting component further comprises a planarization layer on the shape preserving layer in the light exiting direction of the organic light emitting device and in contact with the shape preserving layer;
   a surface of the planarization layer facing the shape preserving layer has a fourth wavy shape, the fourth wavy shape is complementary to the third wavy shape, and a surface of the planarization layer away from the shape preserving layer is planar;
   the organic light emitting device is a bottom-emitting organic light emitting device, and the organic light emitting device further comprises a base substrate and a thin film transistor layer on the base substrate; and
   the transparent light extracting component is between the base substrate and the thin film transistor layer.

2. The organic light emitting device according to claim 1, wherein the shape preserving layer comprises silicon oxide or silicon nitride.

3. The organic light emitting device according to claim 1, wherein a surface of the shape preserving layer away from the light outputting layer has a third wavy shape, and the third wavy shape is identical to the first wavy shape.

4. The organic light emitting device according to claim 1, wherein the organic light emitting device is a top-emitting organic light emitting device, and the organic light emitting device further comprises a base substrate and a light emitting layer on the base substrate; and
   the transparent light extracting component is on a side of the light emitting layer away from the base substrate.

5. The organic light emitting device according to claim 4, wherein the organic light emitting device further comprises an encapsulation layer, and the transparent light extracting component is between the light emitting layer and the encapsulation layer.

6. The organic light emitting device according to claim 4, wherein the transparent light extracting component is reused as an encapsulation layer.

7. The organic light emitting device according to claim 1, wherein the light outputting layer comprises polyimide.

8. The organic light emitting device according to claim 1, wherein the planarization layer comprises polyimide.

9. A method of manufacturing an organic light emitting device, comprising:
- forming a transparent light extracting component comprising a light outputting layer, and a surface of the light outputting layer having a first wavy shape,
- wherein the transparent light extracting component further comprises a shape preserving layer on the light outputting layer in a light exiting direction of the organic light emitting device and in contact with the light outputting layer, and a surface of the light outputting layer facing the shape preserving layer has the first wavy shape;
- a surface of the shape preserving layer facing the light outputting layer has a second wavy shape, the second wavy shape is complementary to the first wavy shape;
- a surface of the shape preserving layer away from the light outputting layer has a third wavy shape,
- the transparent light extracting component further comprises a planarization layer on the shape preserving layer in the light exiting direction of the organic light emitting device and in contact with the shape preserving layer;
- a surface of the planarization layer facing the shape preserving layer has a fourth wavy shape, the fourth wavy shape is complementary to the third wavy shape, and a surface of the planarization layer away from the shape preserving layer is planar;
- the organic light emitting device is a bottom-emitting organic light emitting device, and the organic light emitting device further comprises a base substrate and a thin film transistor layer on the base substrate; and
- the transparent light extracting component is between the base substrate and the thin film transistor layer.

10. The method according to claim 9, wherein the forming the transparent light extracting component comprising the light outputting layer comprises:
- providing a carrier plate; and
- forming the light outputting layer comprising the surface having the first wavy shape by adjusting a moving speed of a coating device when coating, a coating amount at a corresponding position, or a distance between a coating head of the coating device and the carrier plate.

11. The method according to claim 10, wherein subsequent to forming the light outputting layer comprising the surface having the first wavy shape, the method further comprises:
- depositing an inorganic layer on the light outputting layer as a shape preserving layer, so that a surface of the shape preserving layer facing the surface having the first wavy shape of the light outputting layer has a second wavy shape, and the second wavy shape is complementary to the first wavy shape.

12. The method according to claim 11, wherein a surface of the shape preserving layer away from the light outputting layer has a third wavy shape, and
- subsequent to depositing the inorganic layer on the light outputting layer as the shape preserving layer, the method further comprises:
- coating a planarization layer on a surface of the shape preserving layer away from the light outputting layer and in contact with the shape preserving layer, and planarizing the planarization layer, so that a surface of the planarization layer facing the surface having the third wavy shape of the shape preserving layer has a fourth wavy shape, a surface of the planarization layer away from the shape preserving layer is planar, and the fourth wavy shape is complementary to the third wavy shape.

13. The method according to claim 12, further comprising: separating a laminated structure of the light outputting layer, the shape preserving layer and the planarization layer from the carrier plate to obtain the transparent light extracting component.

14. The method according to claim 9, further comprising: forming a light emitting layer on the transparent light extracting component so that light emitted from the light emitting layer is outputted from the transparent light extracting component.

15. The method according to claim 9, wherein the light outputting layer comprises polyimide.

16. The method according to claim 12, wherein the planarization layer comprises polyimide.

\* \* \* \* \*